(12) United States Patent
Huang et al.

(10) Patent No.: US 8,389,341 B2
(45) Date of Patent: Mar. 5, 2013

(54) LATERAL POWER MOSFET WITH HIGH BREAKDOWN VOLTAGE AND LOW ON-RESISTANCE

(75) Inventors: Tsung-Yi Huang, Hsin-Chu (TW); Puo-Yu Chiang, Su-ao Township (TW); Ruey-Hsin Liu, Hsin-Chu (TW); Shun-Liang Hsu, Hsin-Chu (TW); Chyi-Chyuan Huang, Taipei (TW); Fu-Hsin Chen, Jhudong Township (TW); Eric Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 13/175,246

(22) Filed: Jul. 1, 2011

(65) Prior Publication Data

US 2012/0003803 A1    Jan. 5, 2012

Related U.S. Application Data

(63) Continuation of application No. 12/205,961, filed on Sep. 8, 2008, now Pat. No. 7,989,890, which is a continuation-in-part of application No. 11/581,178, filed on Oct. 13, 2006, now Pat. No. 7,476,591.

(51) Int. Cl.
*H01L 21/336* (2006.01)
(52) U.S. Cl. ............... 438/140; 257/343; 257/E21.427
(58) Field of Classification Search .................. 257/343, 257/E21.427; 438/140
See application file for complete search history.

(56) References Cited

U.S. PATENT DOCUMENTS

| | | | |
|---|---|---|---|
| 5,306,652 A | 4/1994 | Kwon et al. | |
| 5,541,435 A | 7/1996 | Beasom | |
| 6,265,752 B1 | 7/2001 | Liu et al. | |
| 6,486,034 B1 | 11/2002 | Huang et al. | |
| 6,713,331 B2 | 3/2004 | Nishibe et al. | |
| 6,873,011 B1 | 3/2005 | Huang et al. | |
| 6,924,531 B2 * | 8/2005 | Chen et al. | 257/336 |
| 7,067,887 B2 * | 6/2006 | Chang et al. | 257/360 |
| 7,202,531 B2 | 4/2007 | Imahashi et al. | |
| 7,476,591 B2 | 1/2009 | Huang et al. | |
| 7,508,032 B2 | 3/2009 | Chiang et al. | |
| 7,576,391 B2 | 8/2009 | Williams et al. | |
| 7,768,071 B2 | 8/2010 | Huang et al. | |
| 2004/0178443 A1 | 9/2004 | Hossain et al. | |
| 2004/0217419 A1 | 11/2004 | Rumennik et al. | |
| 2007/0262398 A1 | 11/2007 | Darwish et al. | |
| 2008/0265292 A1 | 10/2008 | Huang et al. | |
| 2008/0299751 A1 | 12/2008 | Quddus et al. | |
| 2009/0001462 A1 | 1/2009 | Huang et al. | |

(Continued)

OTHER PUBLICATIONS

Gao, S., et al., "Analytical Model for Surface Field of Double RESURF LDMOS with Field Plate," 2006, IEEE, 3 pages.

(Continued)

*Primary Examiner* — Victor A Mandala
(74) *Attorney, Agent, or Firm* — Slater & Matsil, L.L.P.

(57) ABSTRACT

A semiconductor structure includes a semiconductor substrate of a first conductivity type; a pre-high-voltage well (pre-HVW) in the semiconductor substrate, wherein the pre-HVW is of a second conductivity type opposite the first conductivity type; a high-voltage well (HVW) over the pre-HVW, wherein the HVW is of the second conductivity type; a field ring in the HVW and occupying a top portion of the HVW, wherein the field ring is of the first conductivity type; an insulation region over and in contact with the field ring and a portion of the HVW; a gate electrode partially over the insulation region; a drain region in the HVW, wherein the drain region is of the second conductivity type; and wherein the HVW horizontally extends further toward the drain region than the pre-HVW; and a source region adjacent to, and on an opposite side of the gate electrode than the drain region.

14 Claims, 14 Drawing Sheets

U.S. PATENT DOCUMENTS

2009/0039424 A1  2/2009  Su et al.
2009/0085101 A1  4/2009  Huang et al.
2010/0006935 A1* 1/2010  Huang et al. .................. 257/341

OTHER PUBLICATIONS

Liu, M., et al., "A Fully Resurfed, BiCMOS-Compatible, High Voltage MOS Transistor," 8$^{th}$ International Symposium on Power Semiconductor Devices & ICs, ISPSD '96 Proceedings, Maui, HI, May 20-23, 1996, IEEE, pp. 143-146.

Nassif-Khalil, S.G., et al., "SJ/RESURF LDMOST," IEEE Transactions on Electron Devices, vol. 51, No. 7, Jul. 2004, pp. 1185-1191.

Ramezani, M., et al., "A Monolithic IGBT Gate Driver Implemented in a Conventional 0.8μm BiCMOS Process," Proceedings of the 1998 International Symposium on Power Semiconductor Devices & ICs, Kyoto, Jun. 3-6, 1998, IEEE, pp. 109-112.

Terashima, T., et al., "Over 1000V n-ch LDMOSFET and p-ch LIGBT with JI RESURF Structure and Multiple Floating Field Plate," Proceedings of the 1995 International Symposium on Power Semiconductor Devices & ICs, Yokohama, May 23-25, 1995, pp. 455-459.

Imam, M., et al., "Design and Optimization of Double-RESURF High-Voltage Lateral Devices for a Manufacturable Process," IEEE Transactions on Electron Devices, vol. 50, No. 7, Jul. 2003, pp. 1697-1701.

Kim, M.-H., et al., "A Low On- Resistance 700V Charge Balanced LDMOS with Intersected Well Structure.," ESSDERC 2002, pp. 367-370.

Quddus, M.T., et al., "Drain Voltage Dependence of On Resistance in 700V Super Junction LDMOS Transistor," Proceedings of 2004 International Symposium on Power Semiconductor Devices & ICs, Kitakyushu, pp. 201-204.

Disney, D.R., et al., "A New 800V Lateral MOSFET with Dual Conduction Paths," Proceedings of 2001 International Symposium on Power Semiconductor Devices & ICs, Osaka, pp. 399-402.

Hossain, Z., et al., "Field-Plate Effects on the Breakdown Voltage of an Integrated High-Voltage LDMOS Transistor," Proceedings of 2004 International Symposium on Power Semiconductor Devices & ICs, Kitakyushu, pp. 237-240.

Nezar, A., et al., "Breakdown Voltage in LDMOS Transistors Using Internal Field Rings," IEEE Transactions on Electron Devices, vol. 38, No. 7, Jul. 1991, pp. 1676-1680.

* cited by examiner

FIG. 8B
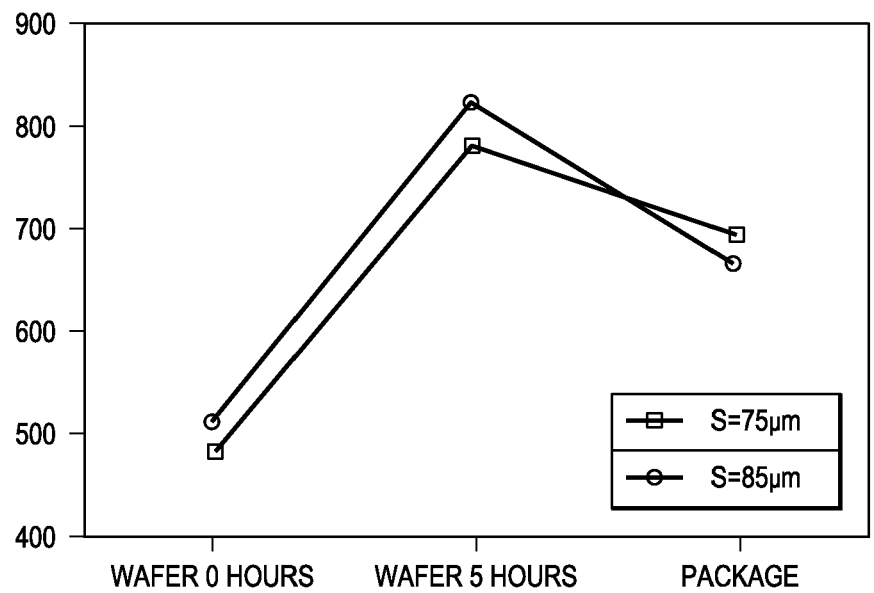
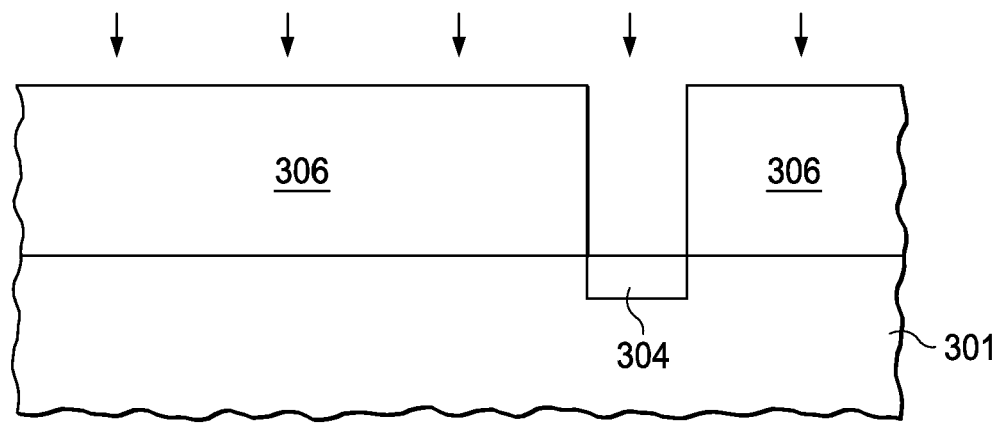
FIG. 9A

LATERAL POWER MOSFET WITH HIGH BREAKDOWN VOLTAGE AND LOW ON-RESISTANCE

This application is a continuation of U.S. patent application Ser. No. 12/205,961, filed Sep. 8, 2008 now U.S. Pat. No. 7,989,890, and entitled "Lateral Power MOSFET with High Breakdown Voltage and Low On-Resistance," which application is a continuation-in-part of U.S. patent application Ser. No. 11/581,178, filed Oct. 13, 2006 now U.S. Pat. No. 7,476,591, and entitled "Lateral Power MOSFET with High Breakdown Voltage and Low On-Resistance," which patent applications are hereby incorporated herein by reference.

TECHNICAL FIELD

This invention relates generally to semiconductor structures and methods, and more particularly to a lateral power metal oxide semiconductor field effect transistor (MOSFET).

BACKGROUND

A lateral power MOSFET is basically a metal oxide semiconductor field effect transistor fabricated with coplanar drain and source regions. FIG. 1A shows a lateral power MOSFET device 100 in the prior art. The device 100 is formed on a p-type substrate 101 and another p-layer 113 is epitaxially grown on the substrate 101. A high-voltage P-well 115 is adjacent a high-voltage N-well 103 in the epitaxially grown p-layer 113. An N+ source 117 is positioned in the high-voltage P-well 115 such that the N+ source 117 is not immediately adjacent the high-voltage N-well 103, and an N+ drain 105 is positioned in the high-voltage N-well 103. Dielectrics 121 are formed to isolate and define areas such as the N+ source 117 and the N+ drain 105 of the device 100. A gate dielectric 111 and a gate electrode 110 are formed extending from the source 117 to a portion of the field dielectric 107. The device 100 also includes a P+ area 119 located in the high-voltage P-well 115. Applying a positive voltage to the gate electrode 110 induces a current to flow through the channel from the N+ source 117 into the high-voltage N-well 103 to be collected at the N+ drain 105.

A problem with this type of lateral power MOSFET is that it cannot maintain a low on-resistance when a high voltage is passed through the lateral power MOSFET. The on-resistance is the power of the current that is transformed into heat as the current travels through the device. The larger the on-resistance of the device, the less efficient the device. Accordingly, it is desired to reduce this resistance as much as possible for a more efficient device.

FIG. 1B illustrates another device 150 known in the prior that is designed to mitigate this problem. Device 150 is similar to device 100 of FIG. 1A, wherein like reference numerals refer to like elements, except a field ring 109 has been added. The field ring 109 works to reduce the surface electrical field and improves the depletion capability of the drift region. As a result, the doping concentration of the drift region can be increased and the on-resistance of the device 100 can be decreased.

Another problem with the prior art device 100 (shown in FIG. 1A) and the prior art device 150 (shown in FIG. 1B) is that the breakdown voltage is not as high as desired. The breakdown voltage is the voltage below which the respective device (such as a MOS capacitor or reverse biased p-n junction) may operate. When a voltage greater than the breakdown voltage is applied, catastrophic and irreversible damage is done to the device, rendering the devices commercially useless and requiring the device to be replaced. Accordingly, increasing the breakdown voltage is highly desirable.

FIG. 2 is a lateral power MOSFET designed to increase the breakdown voltage of the device 200. In FIG. 2 the field dielectrics have been removed from view for clarity. In this device 200 partition regions 201 have been placed into the high-voltage N-well 103, as shown in FIG. 2, such that there are areas of alternating conductivity in the high-voltage N-well region. This type of configuration is known in the art as a superjunction. The partition regions 201 work to increase the horizontal depletion capability of the drift region, which allows for a higher concentration of doping in the drift region. This helps to increase the breakdown voltage and works to reduce the specific on-resistance of the device.

Those prior art systems, however, have difficulties sustaining high voltage and low on-resistance. Therefore, an improved lateral power MOSFET is needed for a reduced on-resistance, a higher breakdown voltage, and a better stability against baking and packaging processes.

SUMMARY OF THE INVENTION

These and other problems are generally solved or circumvented, and technical advantages are generally achieved, by embodiments of the present invention that allow for an extended drift region in a lateral power MOSFET that has a reduced on-resistance and an increased breakdown voltage when the device is placed under high voltage.

In accordance with one aspect of the present invention, a semiconductor structure includes a semiconductor substrate; a pre-high-voltage well (pre-HVW) in the semiconductor substrate, wherein the pre-HVW is of a first conductivity type; a high-voltage well (HVW) over the pre-HVW, wherein the HVW is of the first conductivity type; a field ring in the HVW and occupying a top portion of the HVW, wherein the field ring is of a second conductivity type opposite the first conductivity type; an insulation region over and in contact with the field ring and a portion of the HVW; a gate electrode partially over the insulation region; a drain region in the HVW, wherein the drain region is of the first conductivity type, and wherein the HVW horizontally extends further toward the drain region than the pre-HVW; and a source region adjacent to, and on an opposite side of the gate electrode than the drain region.

In accordance with another aspect of the present invention, a semiconductor structure includes a semiconductor substrate of a first conductivity type; a pre-HVW occupying a surface portion of the semiconductor substrate, wherein the pre-HVW is of a second conductivity type opposite the first conductivity type; an epitaxy layer over and contacting the semiconductor substrate and the pre-HVW; a HVW of the second conductivity type in the epitaxy layer, wherein the HVW has a greater width than a width of the pre-HVW; a field ring in, and occupying a top portion of, the HVW, wherein the field ring is of the first conductivity type; an insulation region over and contacting the field ring and a portion of the HVW; a first well-region occupying a top portion of the HVW, wherein the first well-region is of the second conductivity type, and wherein the first well-region and the pre-HVW are not vertically overlapped; a drain region in the first well-region, wherein the drain region is of the second conductivity type; a second well-region in the epitaxy layer, wherein the second well-region is of the first conductivity type; a gate electrode extend from over the second well-region to over the insulation region; and a source region in the second well-region and adjacent the gate electrode.

In accordance with yet another aspect of the present invention, a semiconductor structure includes a semiconductor substrate of a first conductivity type; a pre-HVW occupying a surface portion of the semiconductor substrate, wherein the pre-HVW is of a second conductivity type opposite the first conductivity type; an epitaxy layer over the semiconductor substrate and the pre-HVW; a HVW of the second conductivity type in the epitaxy layer, wherein the HVW is in contact with the pre-HVW and the semiconductor substrate, and has a greater width than the pre-HVW; a field ring in, and occupying a top portion of, the HVW, wherein the field ring vertically overlaps the pre-HVW with all edges of the field ring being co-terminus with respective edges of the pre-HVW; an insulation region over and contacting the field ring and a portion of the HVW, wherein the field ring is of the first conductivity type; a first well-region in the HVW and occupying a top portion of the HVW, wherein the first well-region is of the second conductivity type; a drain region in the first well-region, wherein the drain region is of the second conductivity type; a second well-region in the epitaxy layer, wherein the second well-region is of the first conductivity type; a gate electrode extend from over the second well-region to over the insulation region; and a source region in the second well-region and adjacent the gate electrode.

In accordance with yet another aspect of the present invention, a method of forming a semiconductor structure includes providing a semiconductor substrate; forming a pre-HVW in the semiconductor substrate, wherein the pre-HVW is of a first conductivity type; forming a HVW over and in contact with the pre-HVW, wherein the HVW is of the first conductivity type; forming a field ring in the HVW and occupying a top portion of the HVW, wherein the field ring is of a second conductivity type opposite the first conductivity type; forming an insulation region over and in contact with the field ring and a portion of the HVW; forming a gate electrode partially over the insulation region; forming a drain region in the HVW, wherein the drain region is of the first conductivity type; and wherein the HVW horizontally extends further toward the drain region than the pre-HVW; and forming a source region adjacent to, and on an opposite side of the gate electrode than the drain region.

In accordance with yet another aspect of the present invention, A method of forming a semiconductor structure includes providing a semiconductor substrate of a first conductivity type; implanting a top portion of the semiconductor substrate to form a pre-HVW, wherein the pre-HVW is of a second conductivity type opposite the first conductivity type; epitaxially growing a semiconductor layer on the semiconductor substrate and the pre-HVW to form an epitaxy layer; implanting a portion of the epitaxy layer to form a high-voltage well (HVW) over and in contact with the pre-HVW, wherein the HVW has a greater width than the pre-HVW, and wherein the HVW is of the second conductivity type; implanting a top portion of the HVW to form a field ring of the first conductivity type, wherein the steps of forming the field ring and the pre-HVW are performed using a same mask; implanting a top portion of the epitaxy layer to form a first well-region, wherein the first well-region is of the second conductivity type, and wherein at least a portion of the first well-region is in the HVW; implanting a top portion of the epitaxy layer to form a second well-region of the first conductivity type, wherein the first and the second well-regions are on opposite sides of the field ring; forming an insulation region over and contacting the field ring and a portion of the HVW; forming a gate electrode extend from over the first well-region to over the insulation region; implanting a portion of the first well-region to form a drain region; and implanting a portion of the second well-region to form a source region, wherein the source region and the drain region are of the second conductivity type.

By using these configurations in semiconductor devices and lateral power MOSFETs that have an extended drift region, the on-resistance of the device is reduced and the breakdown voltage of the device is increased. These all work to improve the performance and efficiency of the semiconductor device.

BRIEF DESCRIPTION OF THE DRAWINGS

For a more complete understanding of the present invention, and the advantages thereof, reference is now made to the following descriptions taken in conjunction with the accompanying drawings, in which:

FIGS. 8A and 8B illustrate the effect of baking and packaging processes to the breakdown voltages of lateral power MOSFETS;

FIGS. 9A through 9H are cross-sectional views of intermediate stages in the formation of an alternative embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel (ultra) high-voltage metal-oxide-semiconductor field-effect transistor (MOSFET) having a reduced on-resistance, an increased breakdown voltage, and an increased stability, and the methods of forming the same are provided. Embodiments of the present invention may be useful for lateral power MOSFETs, particularly when the device is under a high voltage. Throughout the description, the terms "ultra high-voltage MOSFET" and "lateral power MOSFET" are equally referred to. The manufacturing processes are detailed in the following paragraphs. Throughout the various views and illustrative embodiments of the present invention, like reference numbers are used to designate like elements.

An N+ buried layer (NBL) 303 is formed in a portion of the substrate 301 proximate the top surface of the substrate 301. The NBL 303 is preferably formed by implanting n-type dopants into the upper region of the substrate 301. For example, the NBL 303 may be formed by implanting an n-type dopant such as phosphorous at a concentration of between about $3 \times 10^{15}$ and about $3 \times 10^{16}$, and a voltage level of between about 20 to about 200 keV. However, other n-type dopants, such as arsenic, nitrogen, antimony, combinations thereof, or the like could alternatively be used. The n-type dopant of the NBL 303 may then be driven into the substrate 301 by heating the substrate 301 to a temperature of about 1,000° C. to about 1,200° C. The NBL 303 formed preferably comprises a thickness of between about 2 μm and 10 μm, and more preferably has a thickness of about 6 μm, for example.

Figure 1A:
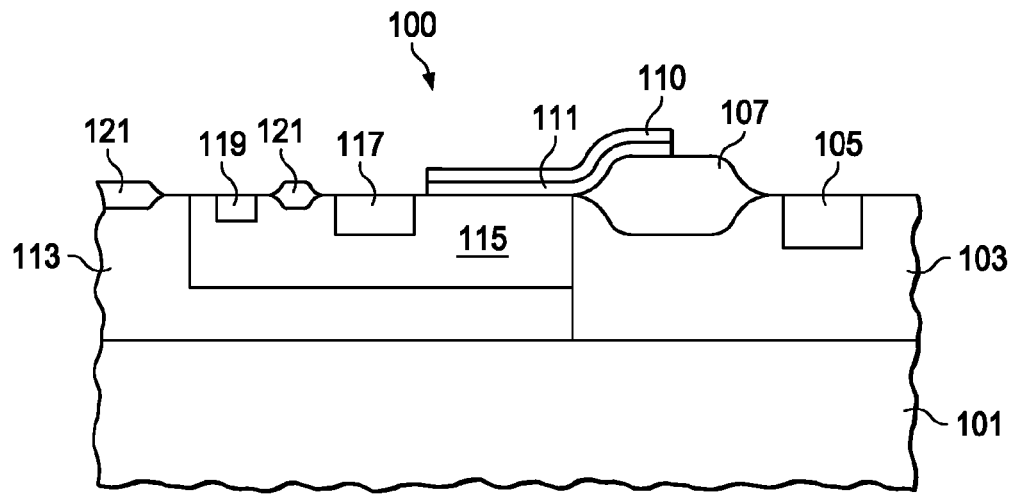
FIG. 1A is a cross-sectional view of a lateral power MOSFET in the prior art.
Figure 1B:
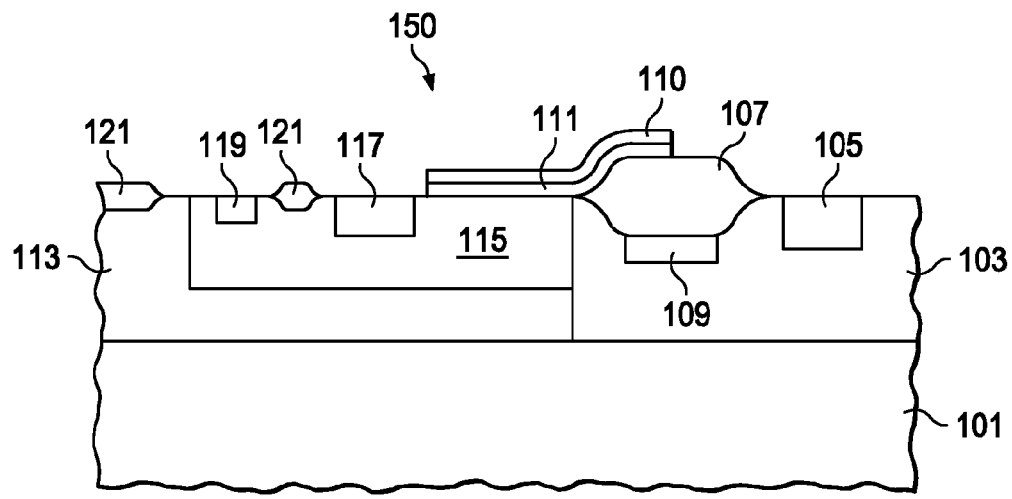
FIG. 1B is a cross-sectional view of a lateral power MOSFET with a field ring in the prior art.
Figure 2:
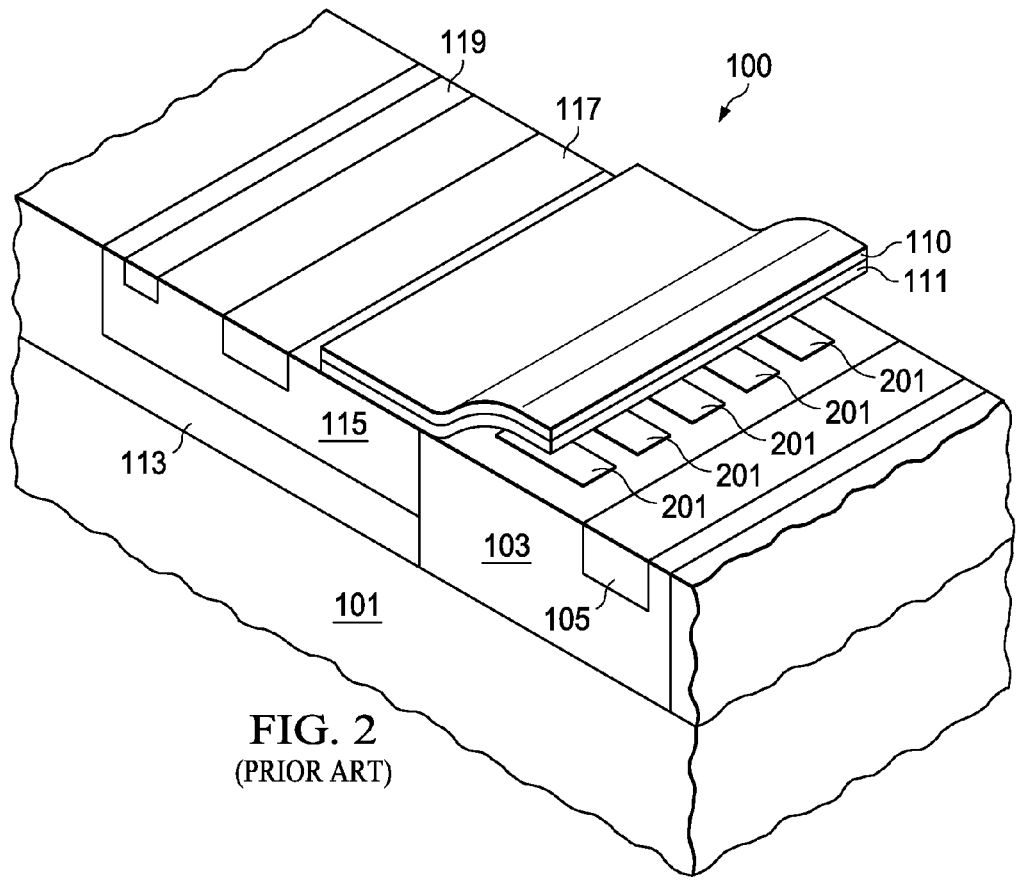
FIG. 2 is a perspective view of a lateral power superjunction MOSFET in the prior art.
Figure 3A:
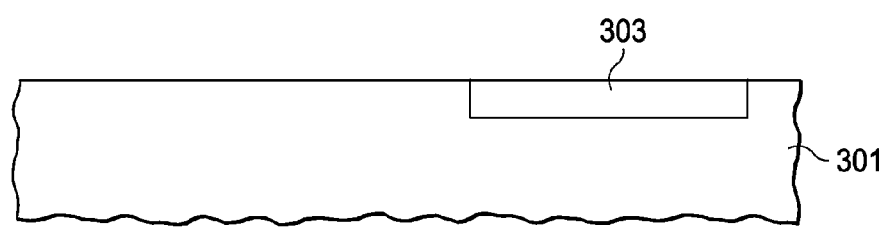
FIGS. 3A-3G are cross-sectional views of various steps of a method of manufacturing of a MOSFET in which an extended drift region is incorporated into a lateral power MOSFET, in accordance with an embodiment of the present invention.
Figure 3B:
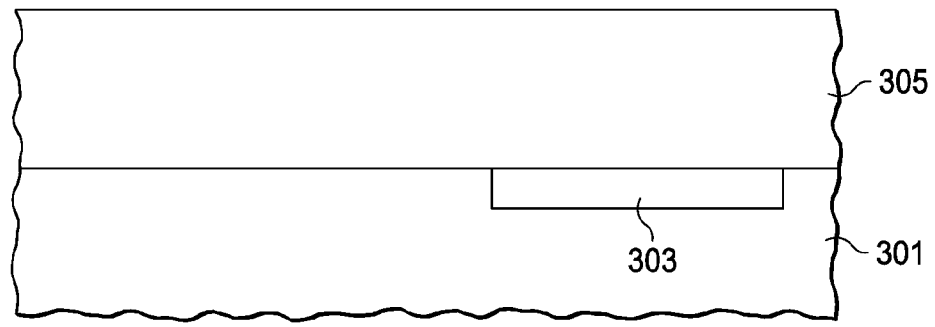

FIG. 3B illustrates a doped semiconductor material 305 being formed over the substrate 301 and the NBL 303 in accordance with an embodiment of the present invention. The doped semiconductor material 305 preferably comprises a P-type semiconductor such as silicon. The doped semiconductor material 305 is preferably formed epitaxially, although other methods may alternatively be used. The doped semiconductor material 305 is referred to herein as a P-epi layer or P-epitaxial layer. Preferably, the P-epi layer 305 is formed in a thickness between about 2 μm and about 5 μm, and more preferably to a thickness of about 4 μm in an embodiment; however, other thicknesses may be used. The P-epi layer 305 may be doped with boron, for example, although other p-type dopants such as gallium, aluminum, indium, combinations thereof, or the like may alternatively be used.

Figure 3C:
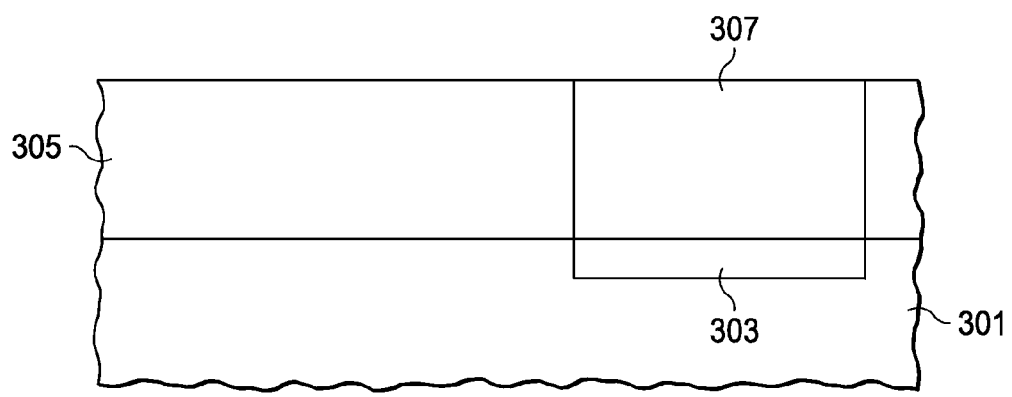

FIG. 3C illustrates the formation of a high-voltage N-well region 307 in accordance with an embodiment of the present invention. The high-voltage N-well region 307 may be formed by implanting an n-type dopant such as phosphorous to a concentration of about $3 \times 10^{15}$ to about $3 \times 10^{16}$ dopant concentration at about 180 KeV, for example. However, other n-type dopants such as arsenic, nitrogen, antimony, combinations thereof, or the like, could alternatively be used. In an embodiment, the high-voltage N-well region 307 has a thickness of about between about 4 μm and about 10 μm, and a preferred thickness of 4 μm.

Figure 3D:
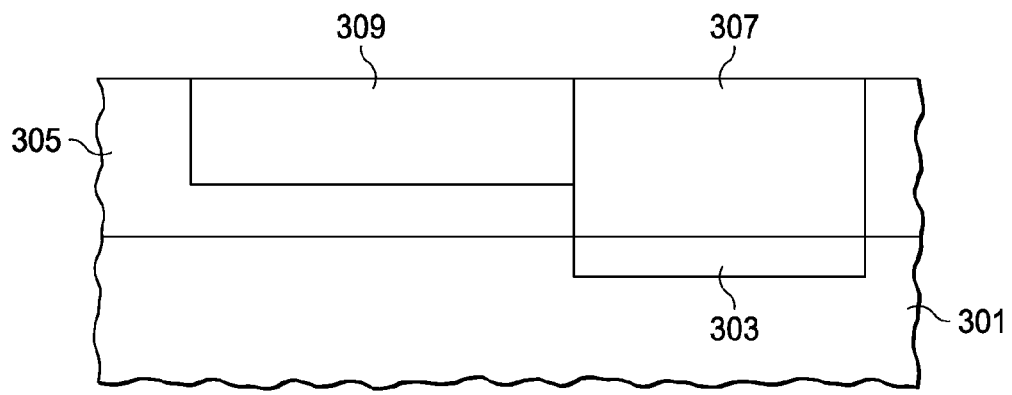

FIG. 3D illustrates the formation of the high-voltage P-well 309 in accordance with an embodiment of the present invention. Preferably, the high-voltage P-well 309 is formed substantially adjacent to the high-voltage N-well 307, such that a junction between the two wells is created. The high-voltage P-well 309 may be formed by doping at least a portion of the P-epi layer 305 with a p-type dopant such as boron at a concentration of between about $1 \times 10^{15}$ to about $2 \times 10^{16}$ at a power of about 100 keV, as an example. In an embodiment, the high-voltage P-well 309 has a depth of between about 2 μm to about 6 μm, with a preferred depth of about 4 μm. However, other p-type dopants such as gallium, aluminum, indium, combinations thereof, or the like could alternatively be used.

Figure 3E:
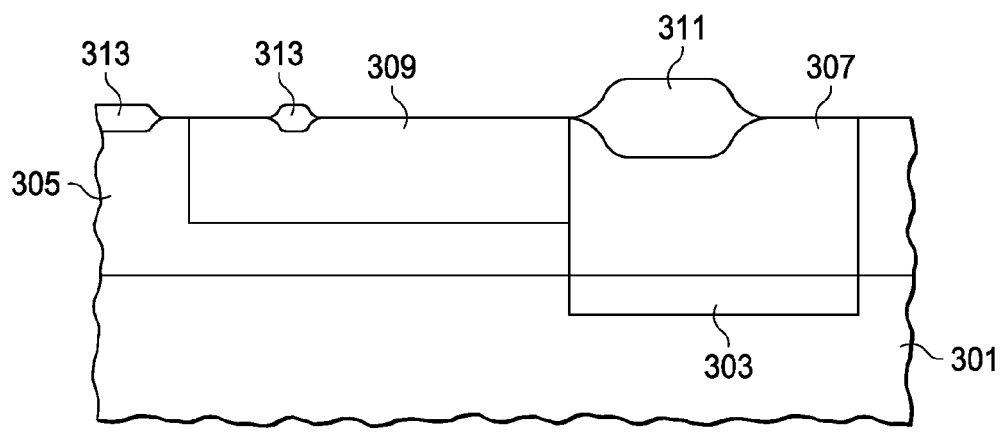

FIG. 3E illustrates the formation of a first field dielectric 311 and a group of second field dielectrics 313 in accordance with an embodiment of the present invention. The first field dielectric 311 is formed over a portion of the high-voltage N-well 307. The second field dielectrics 313 are formed over portions of the high-voltage P-well 309 and the P-epi layer 305, as shown in FIG. 3E. In an embodiment of the present invention the first field dielectric 311 and the second field dielectric 313 are preferably formed simultaneously. The first field dielectric 311 and second field dielectric 313 may comprise silicon dioxide, formed by patterning a masking layer (not shown) to expose portions of the substrate 301 at which the first field dielectric 311 and the second field dielectrics 313 are desired, heating the substrate 301 in the presence of oxygen at a temperature of about 980° C., and then removing the masking layer. The first field dielectric 311 and the second field dielectric 313 preferably comprise a thickness of between about 3,000 Å and about 7,000 Å, with a preferred thickness of about 5,000 Å, for example. However, the first field dielectric 311 and second field dielectric 313 may alternately comprise other thicknesses and materials.

Figure 3F:
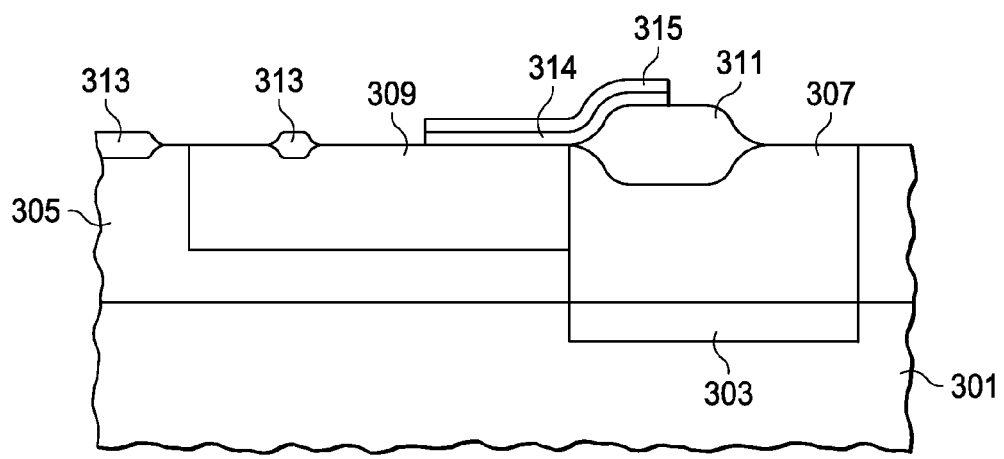

FIG. 3F shows the formation of a gate dielectric 314 and a gate conductor 315 in accordance with an embodiment of the present invention. The gate dielectric 314 is deposited over an upper portion of the field dielectric 311 and extends to cover portions of the high-voltage P-well region 309. A gate conductor 315 is deposited over the gate dielectric 314. The gate conductor 315 comprises a conductive layer such as a doped polysilicon, metal, metal alloy, or the like. Optionally, a surface of the gate conductor 315 may be silicided.

Figure 3G:
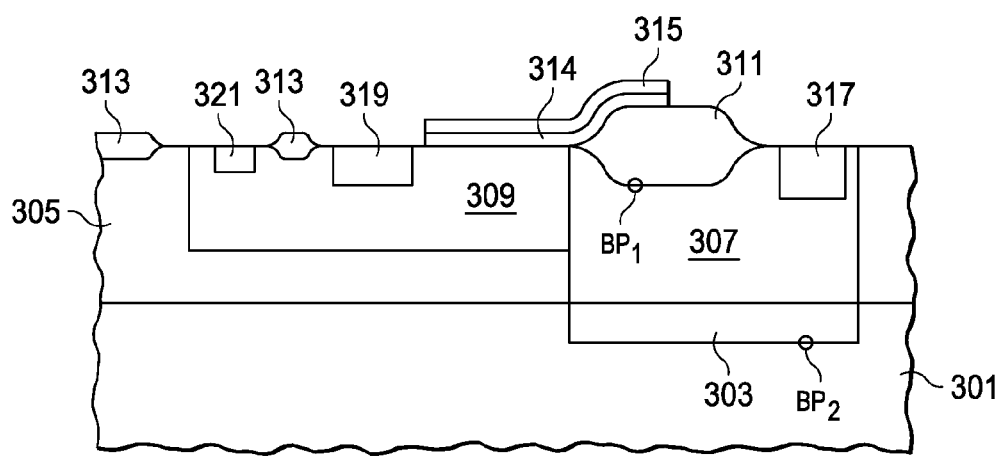

FIG. 3G illustrates the formation of a source region 319 in the high-voltage P-well region 309 and a drain region 317 in the high-voltage N-well region 307. The source region 319 and the drain region 317 can be formed by implanting an n-type dopant such as phosphorous at a concentration of between about $1 \times 10^{19}$ and about $2 \times 10^{20}$ at about 80 KeV, as examples. However, other n-type dopants such as arsenic, nitrogen, antimony, combinations thereof, or the like could alternatively be used.

FIG. 3G also shows the formation of a P+ region 321 that can be formed in the high-voltage P-well region 309. The p-type dopant may be boron implanted at a concentration of between about $1 \times 10^{19}$ and about $2 \times 10^{20}$ at about 70 keV, as an example. Other p-type dopants such as gallium, aluminum, indium, combinations thereof, or the like could alternatively be used.

Optionally, the dimensions and dopant concentrations of the substrate 301, the NBL 303, and the high-voltage N-well region 307 can be set in accordance with the reduced surface field (RESURF) technique, such that the substrate 301, the NBL 303, and the high-voltage N-well region 307 form a single RESURF structure, as is known in the art. This structure reduces the electric field at the junction of the high-voltage P-well 309 and the high-voltage N-well 307, and allows for an even larger increased breakdown voltage of the overall device.

Figure 4A:
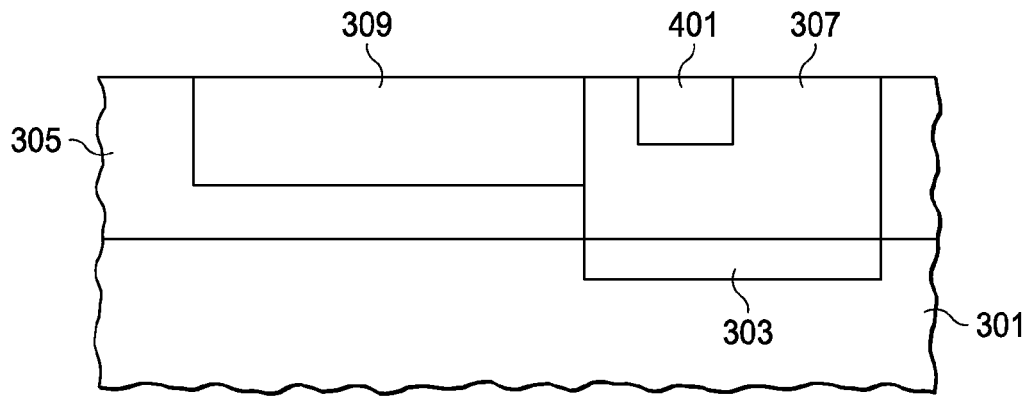
FIGS. 4A-4D are cross-sectional views of various stages of a method of manufacturing of a MOSFET in which an extended drift region is incorporated into a lateral power MOSFET that has a field ring, in accordance with an embodiment of the present invention.
Figure 4B:
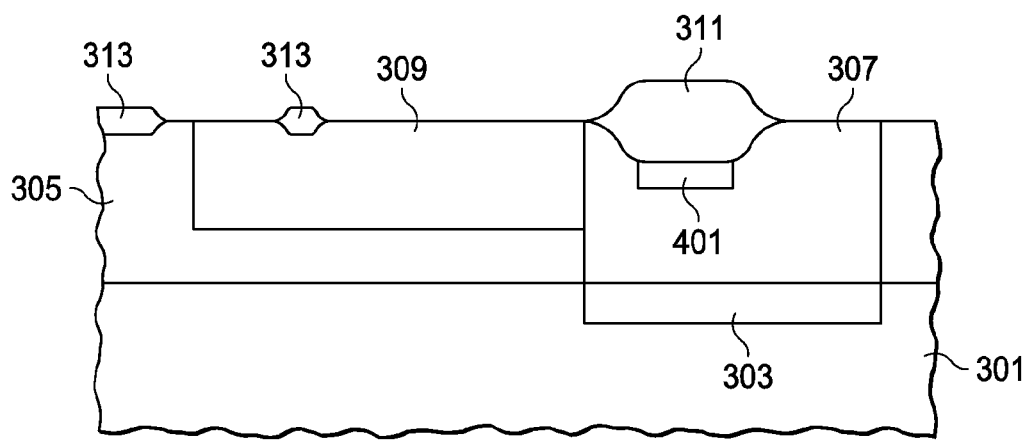
Figure 4C:
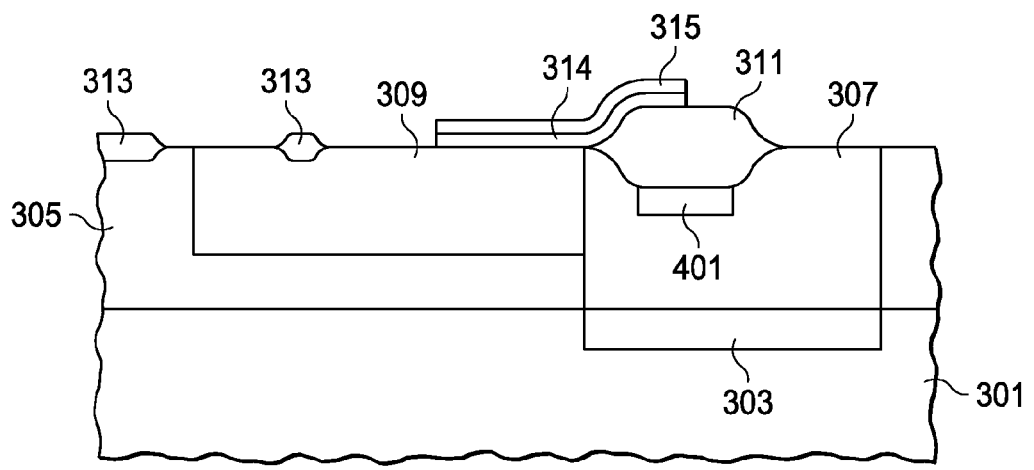

FIGS. 4A to 4C illustrate another embodiment of the present invention, in which a lateral power MOSFET that has a field ring is manufactured with an extended drift region in accordance with an embodiment of the present invention. In this embodiment the initial steps of the manufacturing process are similar to those shown in FIGS. 3A through 3D, wherein like reference numerals refer to like elements. However, FIG. 4A illustrates that a portion of the high-voltage N-well 307 is counter-doped with a p-type dopant to form a field ring 401. The field ring 401 may be formed by doping a portion of the high-voltage N-well 307 with a p-type dopant such as boron to a depth of between about 0.4 μm to about 2 μm, with a preferred depth of about 1 μm. However, other p-type dopants such as gallium, aluminum, indium, combinations thereof, or the like could alternatively be used.

FIG. 4B illustrates the formation of a first field dielectric 311 and a group of second field dielectrics 313 in accordance with an embodiment of the present invention. The first field dielectric 311 is formed over the field ring 401 and a portion of the high-voltage N-well 307. The second field dielectrics 313 are formed over portions of the high-voltage P-well 309 and the P-epi layer 305, as shown in FIG. 4B. The first field dielectric 311 and second field dielectric 313 may be formed as discussed above with reference to FIG. 3E.

FIG. 4C shows the formation of a gate dielectric 314 and a gate electrode 315 in accordance with an embodiment of the present invention. The gate dielectric 314 is deposited over the top surface of the field dielectric 311 and extends to cover a portion of the high-voltage P-well region 309, as shown in FIG. 4C. A gate electrode 315 is deposited over the gate dielectric 314. The gate electrode 315 and gate dielectric 314 may be formed as discussed above with reference to FIG. 3F.

Figure 4D:
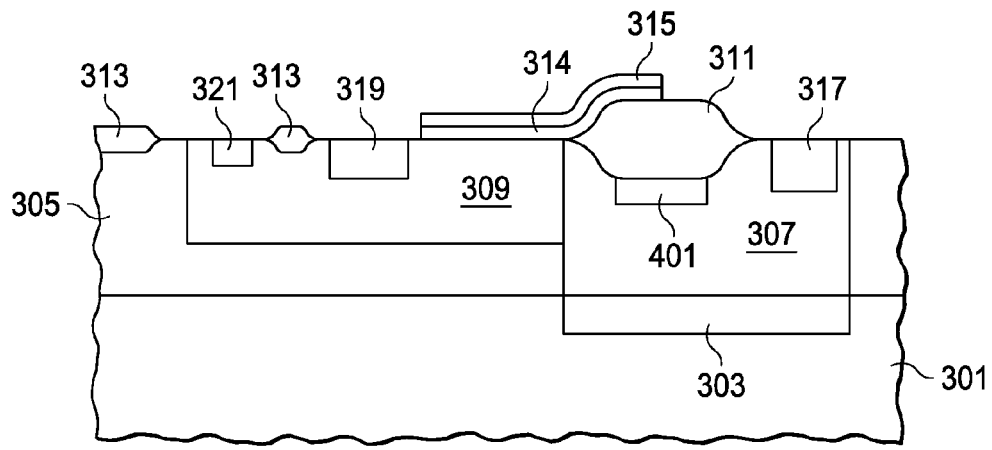

FIG. 4D illustrates the formation of a source region 319 in the high-voltage P-well region 309 and a drain region 317 in the high-voltage N-well region 307 in accordance with an embodiment of the present invention. The source and drain regions may be formed as discussed above with reference to FIG. 3G.

FIG. 4D also shows the formation of a P+ region 321 that will be formed in the high-voltage P-well region in accordance with an embodiment of the present invention. The P+ region 321 may be formed as discussed above with reference to FIG. 3G.

Optionally, the dimensions and dopant concentrations of the substrate 301, the NBL 303, the high-voltage N-well region 307, and the field ring 401 can be set in accordance with the reduced surface field (RESURF) technique, such that the substrate 301, the NBL 303, the high-voltage N-well region 307, and the field ring 401 form a double RESURF structure, as is known in the art. This structure reduces the electric field at the junction of the high-voltage P-well 309 and the high-voltage N-well 307, and allows for an even larger increased breakdown voltage of the overall device.

Figure 5A:
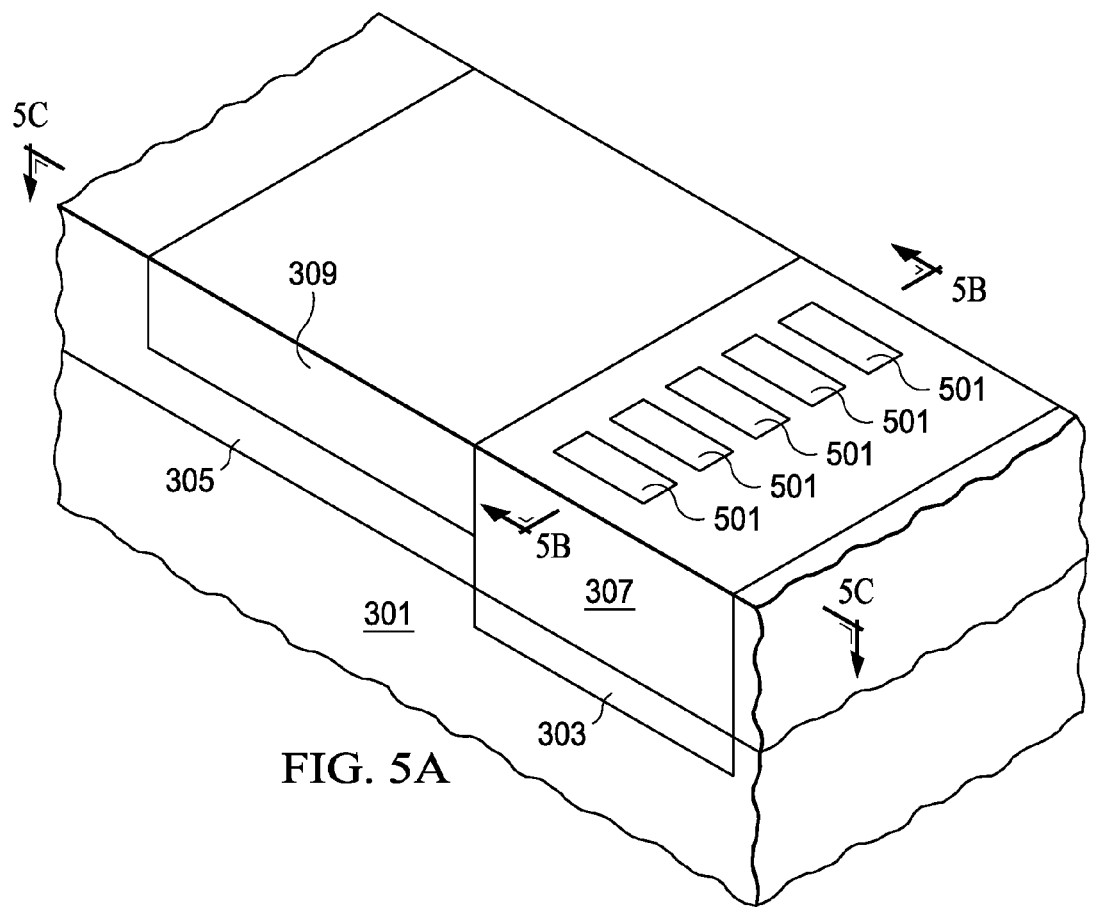
FIGS. 5A-5E are cross-sectional views of various steps of a method of manufacturing of a lateral power superjunction MOSFET in which an extended drift region is incorporated into a lateral power superjunction MOSFET, in accordance with an embodiment of the present invention.

FIGS. 5A-5E illustrate yet another embodiment of the present invention, in which a lateral power superjunction MOSFET is manufactured with an extended drift region. The initial steps of manufacturing this embodiment are similar to the methods as shown through FIGS. 3A-3D. FIG. 5A illustrates that, prior to the formation of the field dielectric 311, partition regions 501 are formed in the high-voltage N-well region 307 to form a superjunction MOSFET, as is known in the art. In this embodiment the partition regions are p-type conductive regions. These partition regions 501 can be formed through ion implantation of a p-type dopant such as boron at a concentration of between about $1\times10^{15}$ and about $2\times10^{16}$ at a power of about 70 keV and a subsequent thermal drive in. However, other p-type dopants such as gallium, aluminum, indium, combinations thereof, or the like could alternatively be used. In an embodiment the partition regions 501 have a depth of between about 0.5 µm and about 5 µm, with a preferred depth of about 3 µm.

Figure 5B:
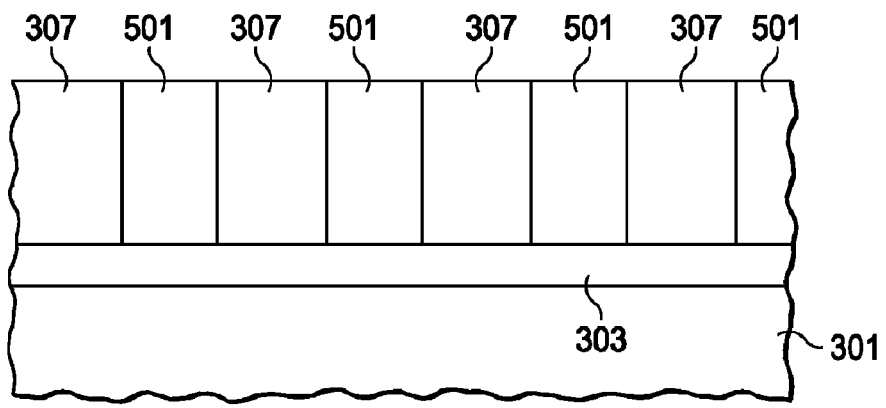

FIG. 5B illustrates another view of the superjunction partition regions 501 taken along the 5B-5B axis in FIG. 5A. In this view, it is shown that the partition regions 501 are interspaced within the high-voltage N-well region 307 to form alternating areas of opposite conductivity. The partition regions 501 preferably extend substantially through the P-epi layer 305 and do not extend into the NBL 303.

Figure 5C:
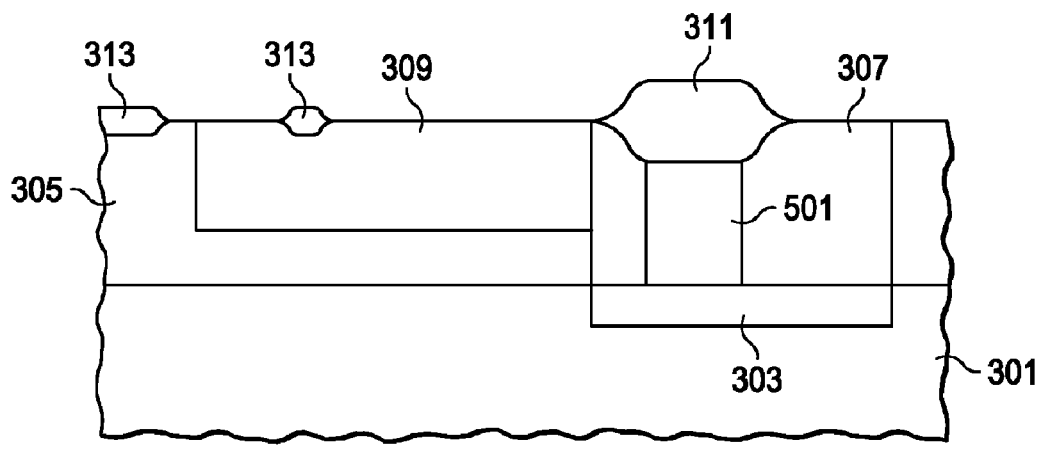

FIG. 5C illustrates the formation of a first field dielectric 311 and a group of second field dielectrics 313 once the partition regions 501 are formed in accordance with an embodiment of the present invention. FIG. 5C is a cross-sectional view taken along the 5C-5C axis in FIG. 5A after the formation of a first field dielectric 311 and second field dielectrics 313. The first field dielectric 311 is formed over a portion of the high-voltage N-well 307 and portions of the partition regions 501. The second field dielectrics 313 are formed over portions of the high-voltage P-well 309 and the P-epi layer 305, as shown in FIG. 5B. The first field dielectric 311 may be formed as discussed above with reference to FIG. 3E.

Figure 5D:
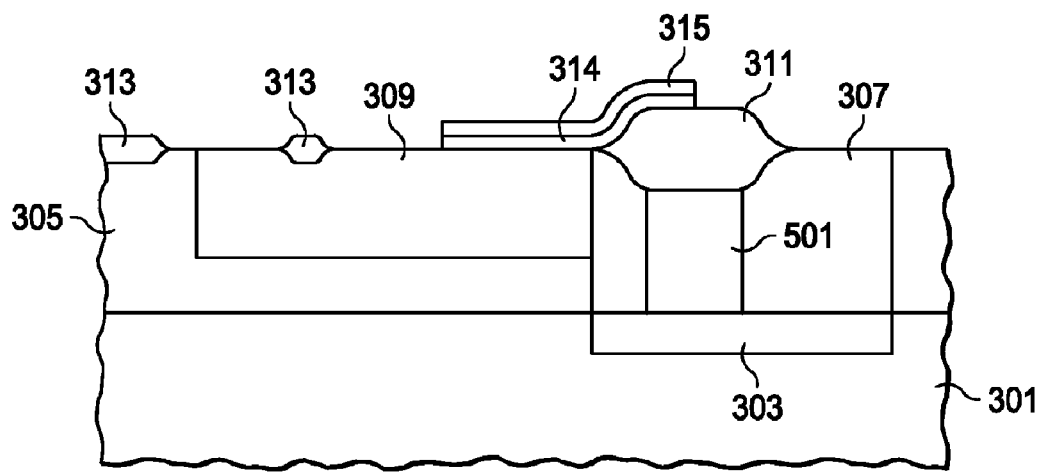

FIG. 5D shows the device of FIG. 5C after the formation of a gate dielectric 314 and a gate electrode 315 in accordance with an embodiment of the present invention. The gate dielectric 314 is deposited over the top surface of the field dielectric 311 and extends to cover portions of the high-voltage P-well region 309, as shown in FIG. 5C. The gate electrode 315 and gate dielectric 314 may be formed as discussed above with reference to FIG. 3F.

Figure 5E:
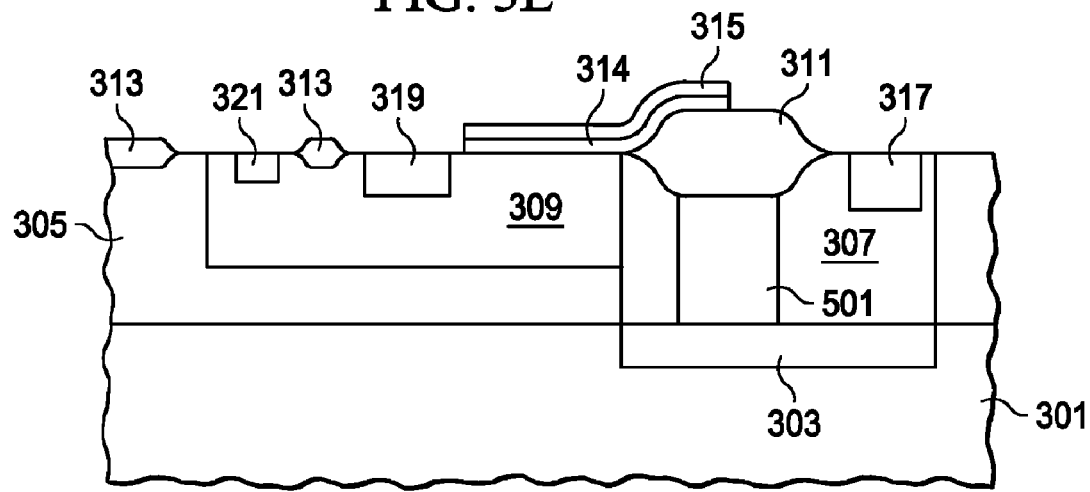

FIG. 5E illustrates the device of FIG. 5D after the formation of a source region 319 in the high-voltage P-well region 309 and a drain region 317 in the high-voltage N-well region 307 in accordance with an embodiment of the present invention. The source region 319 and drain region 317 may be formed as discussed above with reference to FIG. 3G.

FIG. 5E also shows the formation of a P+ region 321 that will be formed in the high-voltage P-well region. The P+ region 321 may be formed as discussed above with reference to FIG. 3G.

Figure 6:
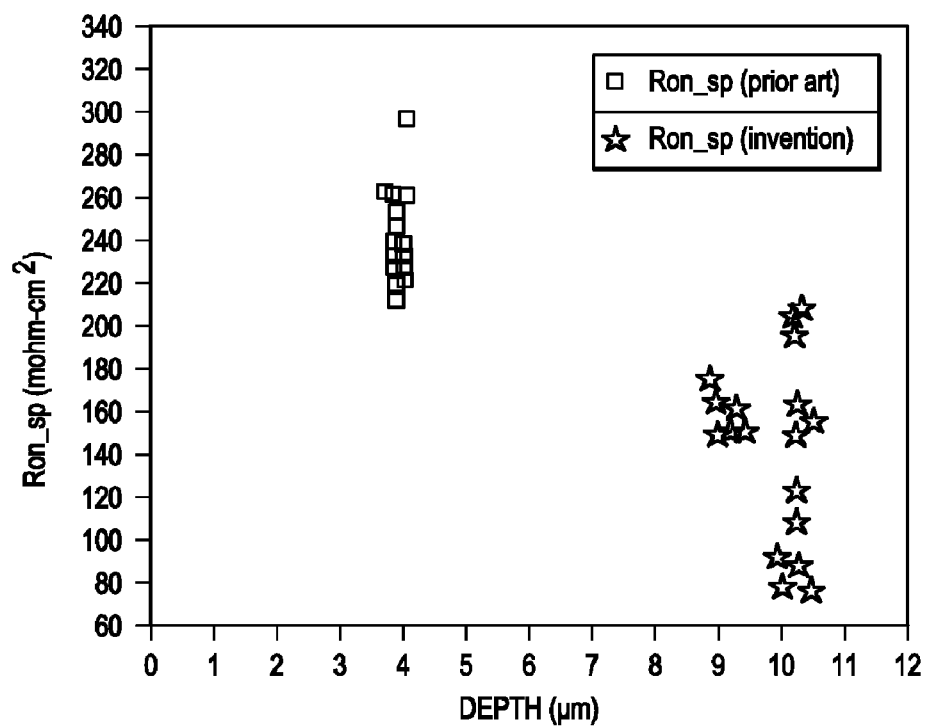
FIG. 6 is a comparison chart of the on-resistance versus the depth of the drift region in an embodiment of the present invention and traditional lateral power MOSFETS.

FIG. 6 is a chart that shows a comparison of the on resistance of a semiconductor device in relation to the depth of the drift region between an embodiment of the present invention and a traditional semiconductor device. As shown, an increase in the depth of the drift region from about 4 µm to about 10 µm may translate to about a 65% improvement of the on-resistance of the device.

Figure 7:
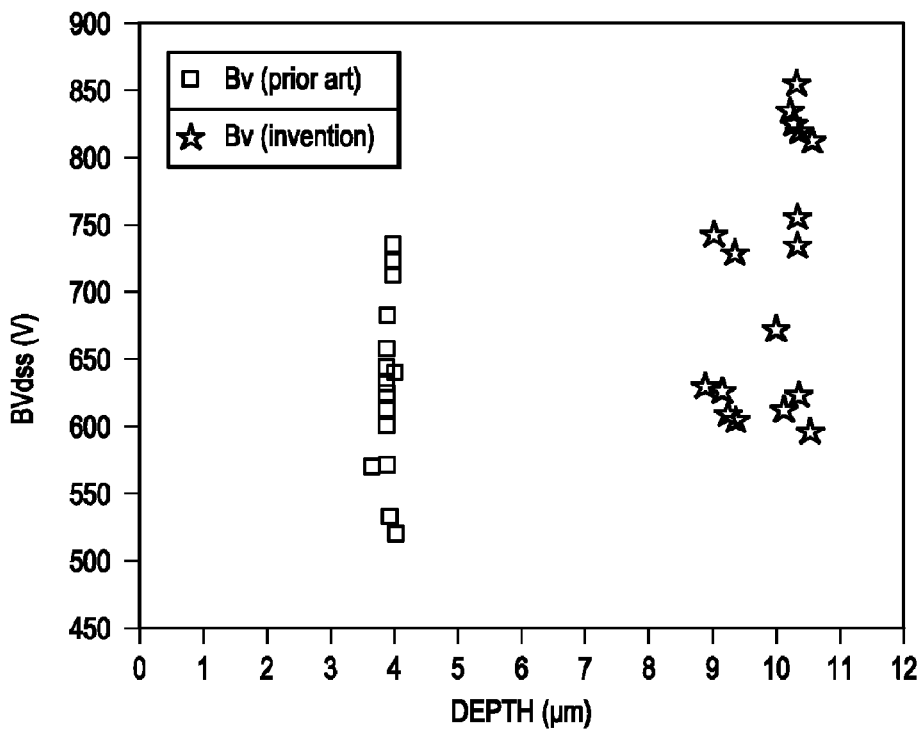
FIG. 7 is a comparison of the breakdown voltage versus the depth of the drift region in an embodiment of the present invention and traditional lateral power MOSFETS.

FIG. 7 is a chart that shows a comparison of the breakdown voltage of a semiconductor device in relation to the depth of the drift region between the present invention and a traditional semiconductor device. As shown, an increase in the depth of the drift region from about 4 µm to about 10 µm may lead to about a 15% improvement in the breakdown voltage over traditional lateral power MOSFETs.

Figure 8A:
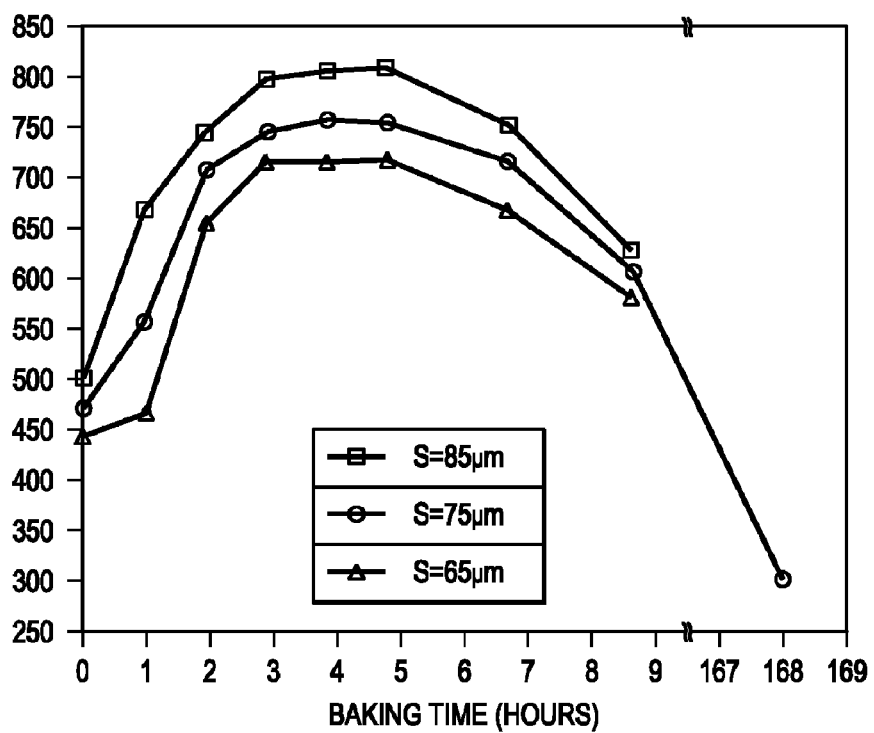

Although the high-voltage MOSFET shown in FIG. 3G has significantly improved breakdown voltages, the breakdown voltages are sometimes unstable, and may be affected by subsequent baking and packaging processes. FIG. 8A illustrates the breakdown voltages of high-voltage MOSFETs as a function of baking time, wherein the high-voltage MOSFETs have the structures shown in FIG. 3G. The high-voltage MOSFETs having the drift region sizes S of 65 µm, 75 µm and 85 µm were baked at about 150° C., and the breakdown voltages of the MOSFETs were measured. It was found that due to the baking, the breakdown voltages become unstable, and may increase and decrease over the baking time.

In addition, the breakdown voltages of the MOSFETs are also affected by the packaging processes. FIG. 8B illustrates the effect of thermal budget caused by packaging processes to the breakdown voltages of MOSFETs. It is noted after five hours of baking at 150° C., the breakdown voltages increases, while additional packaging processes, which contain additional thermal processes, cause the breakdown voltages to decrease.

FIGS. 9A through 9H are cross-sectional views of intermediate stages in the formation of another high-voltage MOSFET embodiment, whose breakdown voltage is not substantially affected by the baking and packaging processes.

Referring to FIG. 9A, substrate 301 is provided. Pre-HVNW region 304 is formed in a top portion of substrate 301. Pre-HVNW region 304 is preferably formed by implanting n-type dopants into the upper region of the substrate 301, for example, by forming photo resist 306. The pre-HVNW region 304 may be formed by implanting phosphorous to a dosage of between about $1\times10^{10}/cm^2$ and about $1\times10^{16}/cm^2$. However, other n-type dopants, such as arsenic, antimony, combinations thereof, or the like, could alternatively be used. The n-type dopant of the pre-HVNW region 304 may then be driven into the substrate 301 by heating the substrate 301 to a temperature of about 1,000° C. to about 1,200° C. Pre-HVNW region 304 preferably has a thickness of between about 2 μm and 10 μm, and more preferably about 8.5 μm, for example. After the formation of pre-HVNW region 304, photo resist 306 is removed.

Figure 9B:
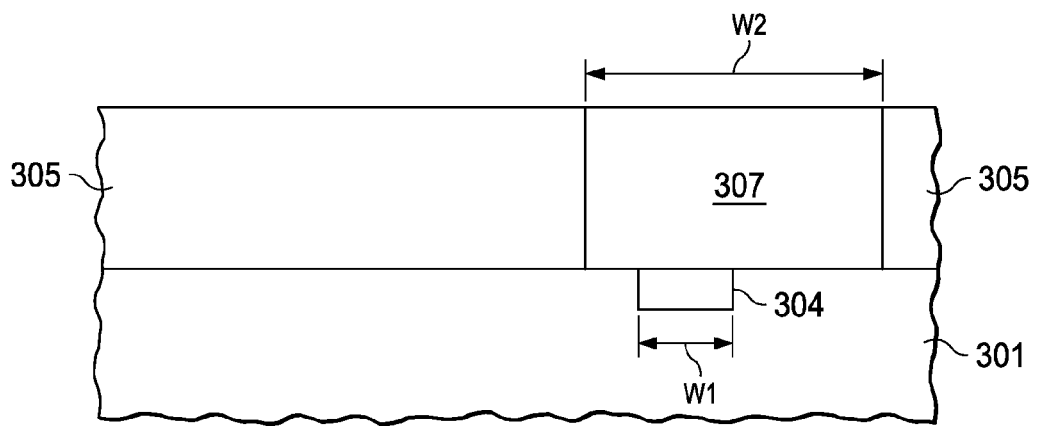

FIG. 9B illustrates a doped semiconductor material 305 being formed over substrate 301 and pre-HVNW region 304. The doped semiconductor material 305 preferably comprises a P-type semiconductor such as silicon. The doped semiconductor material 305 may be grown epitaxially, and hence is alternatively referred to as epitaxy layer 305. After the formation of doped semiconductor material 305, the steps shown in FIGS. 9A and 9B may be repeated, that is, implanting the doped semiconductor material 305 using the same mask as photo resist 306, so that the thickness of pre-HVNW region 304 is increased. In this case, an additional doped semiconductor material essentially the same as doped semiconductor material 305 need to be formed before the subsequent manufacturing steps are performed. The thickness of doped semiconductor material 305 may be greater than about 1 μm, and more preferably between about 1 μm and about 100 μm.

FIG. 9B also illustrates the formation of a high-voltage N-well region 307 in accordance with an embodiment of the present invention. The high-voltage N-well region 307 may be formed by implanting an n-type dopant such as phosphorous, arsenic, or the like. Preferably, the concentration of high-voltage N-well region 307 is greater than the impurity concentration of pre-HVNW region 304, and may be formed using a dosage of about $1\times10^{10}/cm^2$ to about $1\times10^{16}/cm^2$. In an embodiment, the high-voltage N-well region 307 has a thickness of about between about 4 μm and about 10 μm, and a preferred thickness of 5 μm. Preferably, high-voltage N-well region 307 has a greater width W2 than the width W1 of pre-HVNW region 304, and more preferably laterally extends beyond the underlying pre-HVNW region 304 in both directions. The bottom of high-voltage N-well region 307 contacts the pre-HVNW region 304.

Figure 9C:
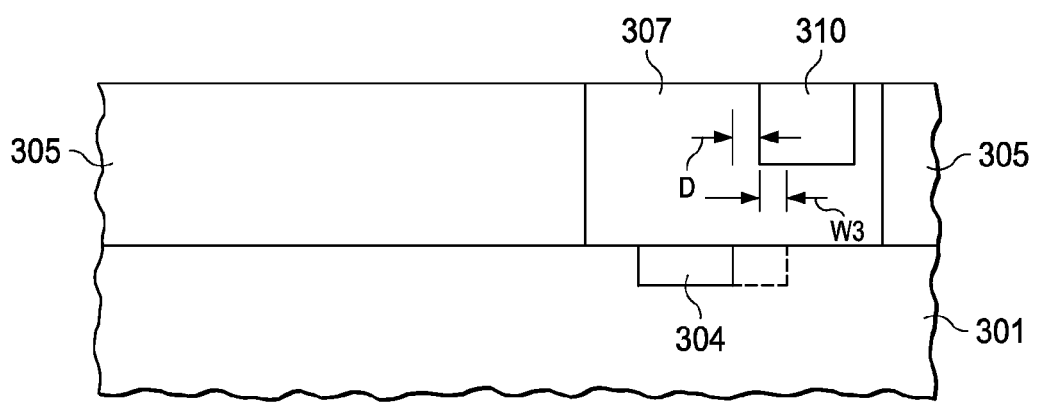

FIG. 9C illustrates the formation of the N-well 310. Preferably, N-well 310 is formed by forming a photo resist (not shown), and implanting an n-type impurity, for example, to a concentration greater than that of high-voltage N-well region 307. In an exemplary embodiment, the dosage of the implantation is between about $1\times10^{10}/cm^2$ to about $1\times10^{16}/cm^2$. N-well 310 preferably has a bottom surface higher than the bottom surface of high-voltage N-well region 307. Alternatively, the bottom surface of N-well 310 may be level with, or lower than, the bottom surface of high-voltage N-well region 307.

Preferably, pre-HVNW region 304 and N-well 310 has no parts vertically overlapping each other. Accordingly, the horizontal distance D between pre-HVNW region 304 and N-well 310 may be greater than 0 μm, and more preferably between 0 μm and about 3 μm. Alternatively, the edges of pre-HVNW region 304 and N-well 310 are substantially vertically aligned, which means the horizontal distance D is equal to 0 μm, or the overlap width W3, if any, is less than about 3 μm, wherein dotted lines are used to show the edge of pre-HVNW region 304 in the case the overlapping occurs.

Figure 9D:
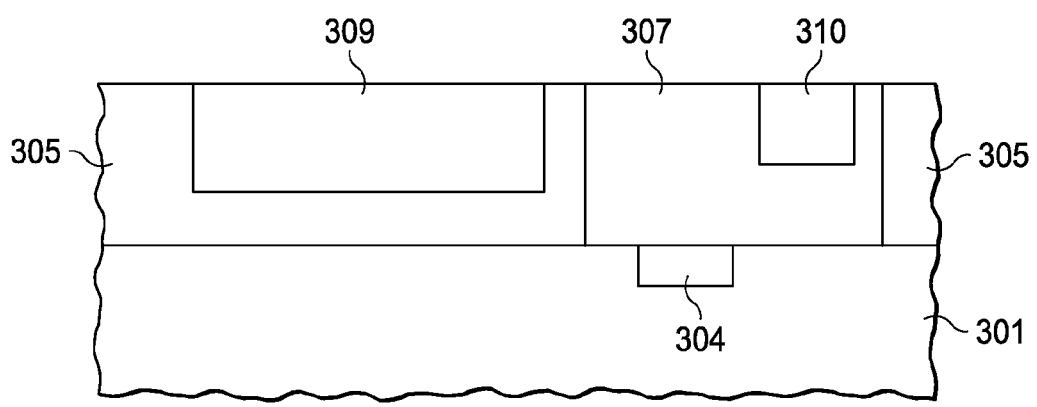

FIG. 9D illustrates the formation of P-well 309. Preferably, the high-voltage P-well 309 is formed adjacent to the high-voltage N-well 307. In an embodiment, high-voltage P-well 309 is spaced apart from high-voltage N-well 307, as shown in FIG. 9D. In alternative embodiments, high-voltage P-well 309 adjoins high-voltage N-well 307 such that a junction between the two wells is created. P-well 309 may be formed by forming a photo resist (not shown), and doping a desired portion of the epitaxy layer 305 with a p-type dopant such as boron, indium, and the like. P-well 309 is sometimes referred to as a high-voltage P-well region in the case the impurity concentration is low. In an embodiment, P-well 309 has a depth of between about 2 μm to about 6 μm, with a preferred depth of about 4 μm.

Figure 9E:
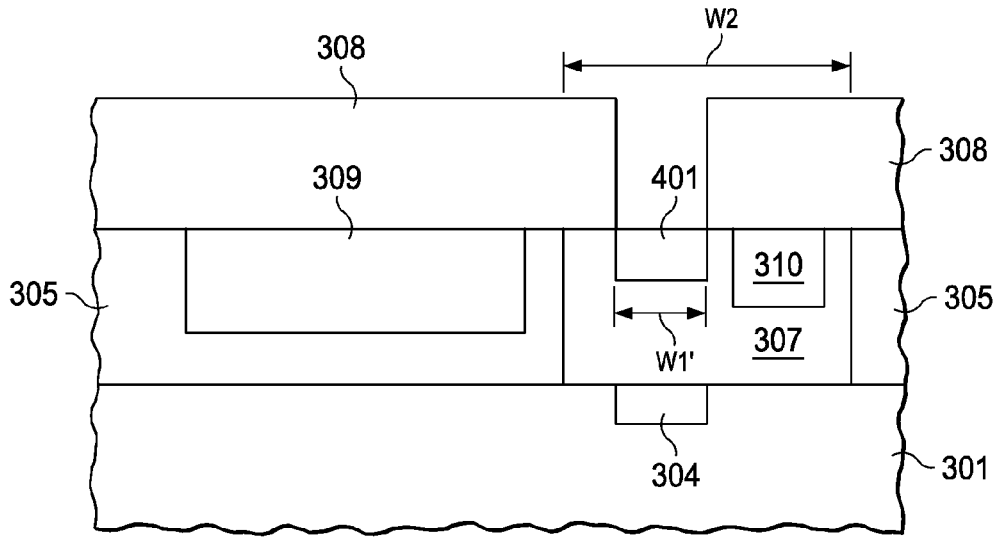
Figure 9F:
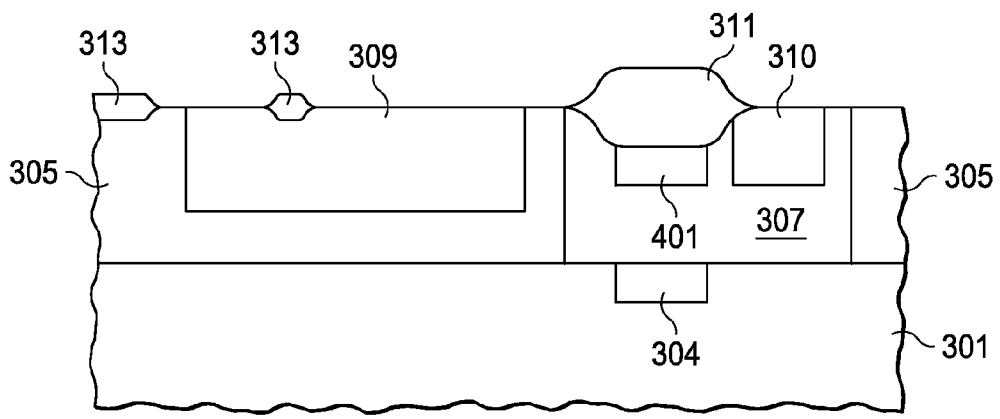

FIG. 9E illustrates the counter-doping of a top portion of N-well 307 to form counter-doped region 401. In an embodiment, counter-doped region 401 has a ring shape (refer to FIG. 11), and hence is also referred to as field ring 401 throughout the description. Field ring 401 may be doped with a p-type dopant to a depth of between about 0.4 μm to about 2 μm, with a preferred depth of about 1 μm. Accordingly, field ring 401 may alternatively be referred to as p-ring 401. The bottom of field ring 401 is spaced apart from the bottom of high-voltage N-well 307. The thickness of field ring 401 is great enough, so that after the subsequent formation of field dielectric 311 as shown in FIG. 9F, there are still remaining field ring 401 under field dielectric 311. Preferably, the side edges of field ring 401 are spaced apart from the respective side edges of high-voltage N-well 307. If viewed from top, field ring 401 appears to be embedded in high-voltage N-well 307, with a width W1' of field ring 401 less than width W2 of high-voltage N-well 307.

In the preferred embodiment, the photo resist 308 used for forming field ring 401 is formed using the same mask as forming photo resist 306 (refer to FIG. 9A), wherein the mask is used for defining the lithography patterns of the photo resists (or other hard masks). Accordingly, all edges of field ring 401 co-terminate, or substantially co-terminate, with the respective edges of pre-HVNW region 304. In an embodiment, field ring 401 adjoins N-well region 310. In alternative embodiments, field ring 401 is spaced apart from N-well region 310. Field ring 401 may also be formed using a different mask than the one used for forming photo resist 306 and pre-HVNW region 304. In this case, field ring 401 may be larger or smaller than pre-HVNW region 304.

FIG. 9F illustrates the formation of a field dielectric 311 and a group of field dielectrics 313. Field dielectric 311 is formed over a portion of the high-voltage N-well 307. Field dielectrics 313 may be formed over portions of the high-voltage P-well 309 and the P-epi layer 305. The formation methods of field dielectrics 311 and 313 include local oxidation of silicon (LOCOS). Alternatively, field dielectrics 311 and 313 may be shallow trench isolation (STI) regions.

Figure 9G:
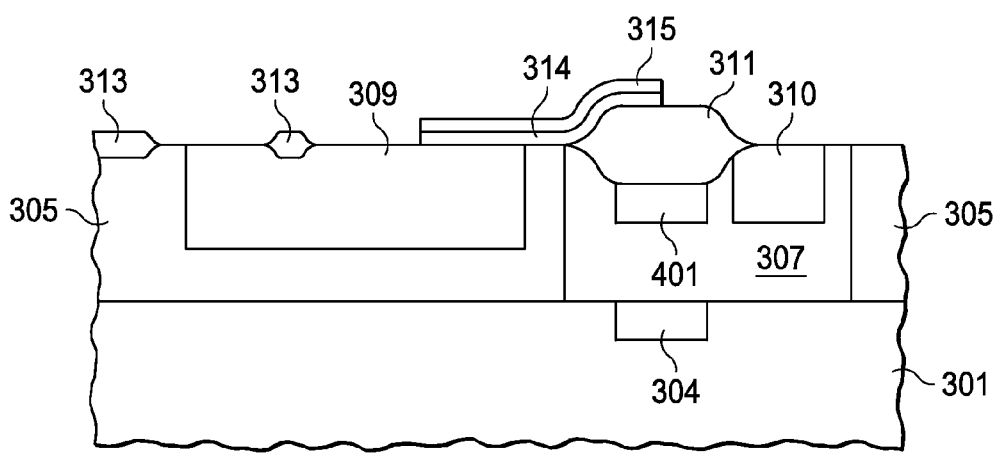

FIG. 9G shows the formation of gate dielectric 314 and gate conductor 315. Gate dielectric 314 is deposited over an upper portion of the field dielectric 311 and extends to cover portions of the high-voltage P-well region 309. Gate conductor 315 is deposited over the gate dielectric 314. The gate conductor 315 includes a conductive material such as a doped polysilicon, metal, metal alloy, or the like. Optionally, a surface of the gate conductor 315 may be silicided.

Figure 9H:
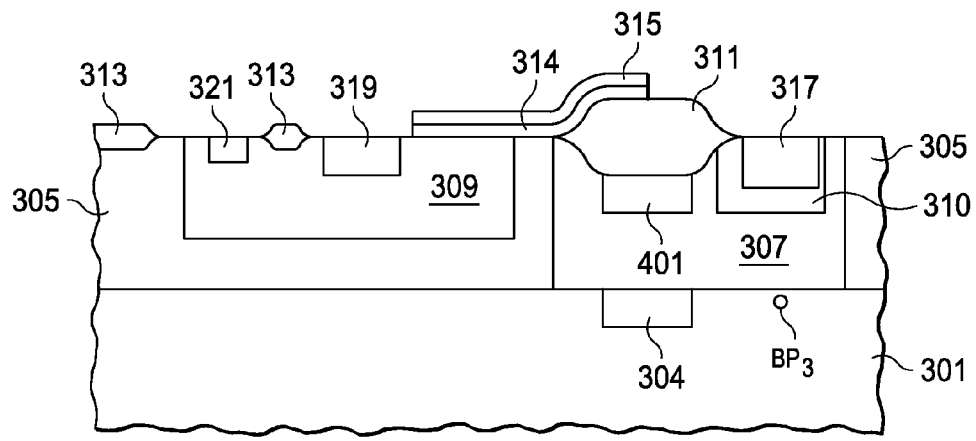

FIG. 9H illustrates the formation of source region 319 in high-voltage P-well region 309, and drain region 317 in the high-voltage N-well region 307 and n-well region 317. The source region 319 and the drain region 317 can be formed by implanting an n-type dopant such as phosphorous to a concentration of between about $1 \times 10^{19}$ and about $2 \times 10^{21}$, as an example.

FIG. 9H also shows the formation of a P+ region 321 (also referred to as a pickup region) in high-voltage P-well region 309. The p-type dopant may be implanted with boron to a concentration of between about $1 \times 10^{19}$ and about $2 \times 10^{21}$.

Advantageously, by making pre-HVNW region 304 substantially co-terminus with field ring 401, the breakdown voltages of the high-voltage MOSFETs become more stable, and are affected less by the subsequent baking processes and packaging processes. Refer to FIG. 3G, in the case pre-HVNW region 304 is co-terminus with high-voltage N-well 307, the breakdown points are very likely to be at point BP1, which is at the interface between field dielectric 311 and high-voltage N-well 307. The breakdown may also occur at point BP2, which is at the interface between pre-HVNW region 303 and substrate 301. A disadvantageous feature of having breakdown in these locations is that the interface conditions may be significantly affected by process variations, causing the breakdown voltages of the HVMOS devices to be un-stable. By reducing the size of pre-HVNW region 304 (FIG. 9H), the location of breakdown is moved to point BP3 (as shown in FIG. 9H), which is at a bulk region instead of an interface region. Accordingly, the breakdown voltages of the resulting HVMOS devices are more stable.

Figure 10:
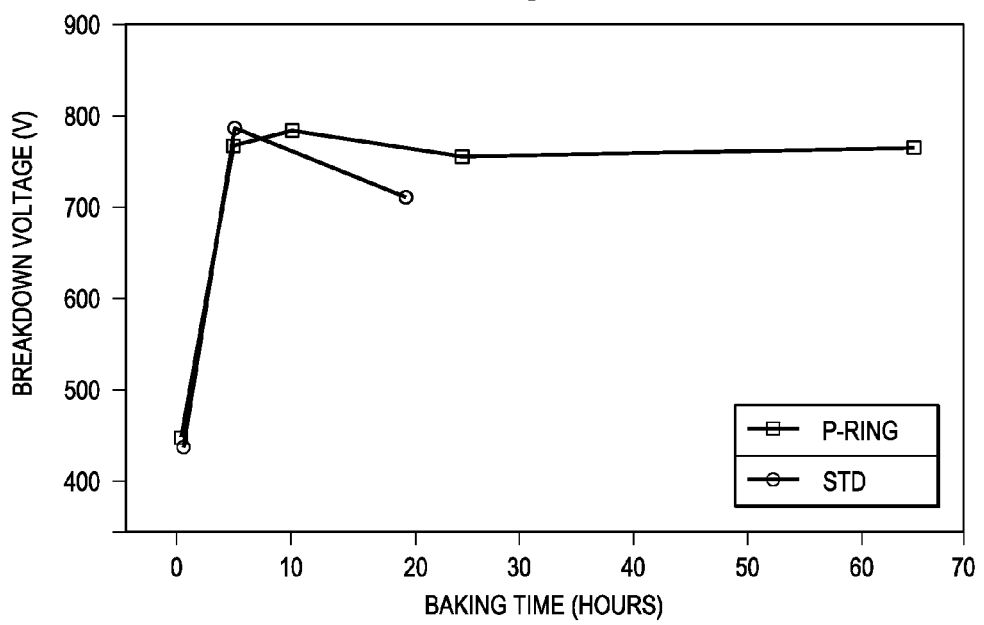
FIG. 10 illustrates the effect of thermal budget to the breakdown voltages of the structures shown in FIGS. 3G and 9H.

FIG. 10 illustrates the breakdown voltages of UHV MOSFETs as a function of baking time, wherein circles are the data obtained from first samples having a structure as shown in FIG. 3G, while the squares are obtained from second samples having a structure shown in FIG. 9H. It was found that with the time of baking, the breakdown voltages of the second samples are substantially stable even after about 60 hour baking, while the breakdown voltages of the first samples are significantly more unstable, and will decrease.

As one of ordinary skill in the art will appreciate, embodiments as presented herein are merely illustrative embodiments of the present invention. For example, while the discussed embodiment is a p-type lateral power MOSFET, another embodiment could be an n-type lateral power MOSFET, with the conductivity types of source/drain regions, high-voltage well regions, pre-HVNW region, well-regions, substrate, and the like, inverted.

Figure 11:
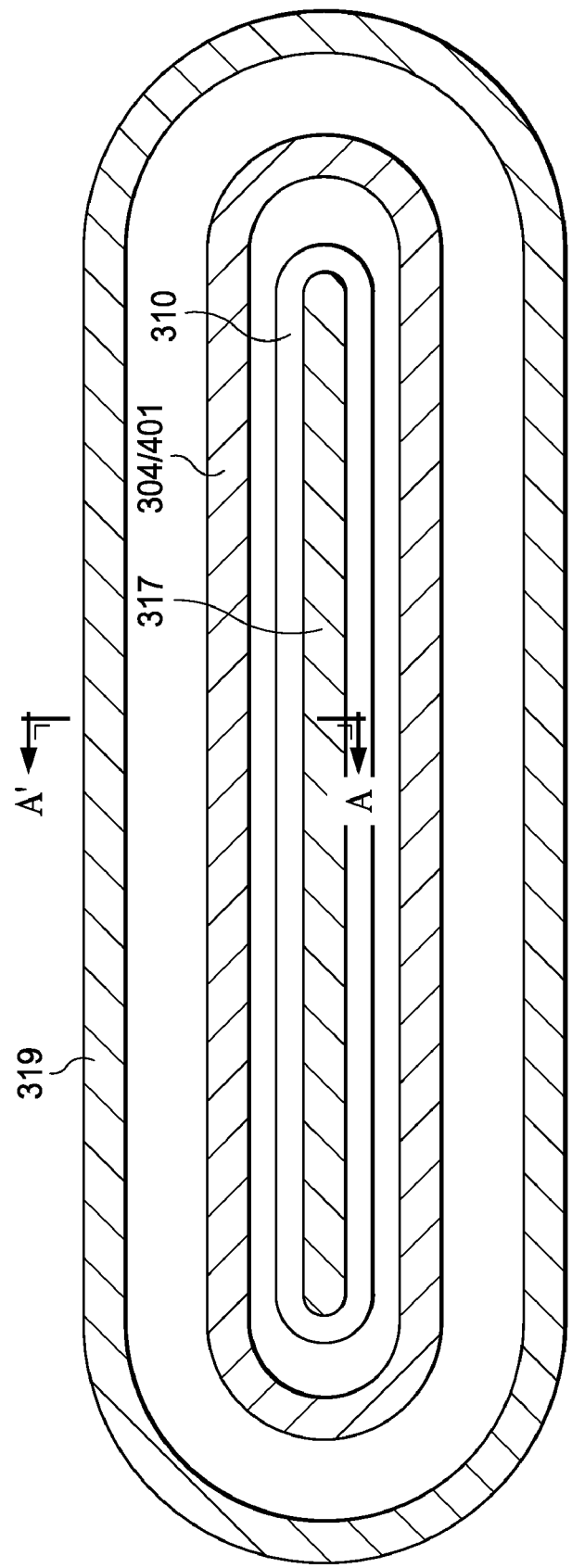
FIG. 11 is a top view of an exemplary lateral power MOSFET shown in FIG. 9H.

FIG. 11 illustrates an exemplary top view of the embodiment shown in FIG. 9H, wherein drain region 317 is a long strip, and source region 319 forms a closed loop encircling drain 317. Pre-HVNW region 304 and field ring 401 overlap each other, and form closed loops located between drain 317 and source region 319. The cross-sectional view shown in FIG. 9H may be taken along a plane crossing line A-A' in FIG. 11 (with some components slightly altered). For simplicity, other components of the high-voltage MOSFET are not shown. It is to be realized that the structure shown in FIG. 11 is only one of the implementations, and other commonly used implementations such as rectangular shaped MOSFETs, horseshoe shaped MOSFETs, or the like, are also in the scope of the present application.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A method comprising:
   performing an implantation to form a pre-high-voltage well (pre-HVW) in a semiconductor substrate, wherein the pre-HVW is of a first conductivity type;
   forming a high-voltage well (HVW) over and in contact with the pre-HVW, wherein the HVW is of the first conductivity type, and wherein the HVW has a higher impurity concentration than the pre-HVW;
   performing an implantation to form a field ring in the HVW and occupying a top portion of the HVW, wherein the field ring is of a second conductivity type opposite the first conductivity type;
   forming an insulation region over and in contact with the field ring and a portion of the HVW;
   forming a gate electrode partially over the insulation region;
   forming a drain region in the HVW, wherein the drain region is of the first conductivity type; and wherein the HVW horizontally extends further toward the drain region than the pre-HVW; and
   forming a source region adjacent to, and on an opposite side of the gate electrode than the drain region.

2. The method of claim 1, wherein the steps of forming the field ring and the pre-HVW are performed using a same mask for defining lithography patterns.

3. The method of claim 1, wherein the steps of forming the field ring and the pre-HVW are formed using different masks for defining lithography patterns.

4. The method of claim 1 further comprising performing an epitaxy to form an epitaxy layer on the pre-HVW and the semiconductor substrate, wherein the HVW, the field ring, the source region, and the drain region are formed by implanting the epitaxy layer.

5. The method of claim 1, wherein the field ring has a first width smaller than a second width of the HVW, and wherein the first and the second widths are measured in a direction parallel to a major surface of the semiconductor substrate.

6. The method of claim 1 further comprising:
   forming a first well-region of the second conductivity type, wherein the source region is in the first well-region; and
   forming a second well-region of the first conductivity type, wherein the drain region is in the second well-region.

7. The method of claim 6, wherein the second well-region and the pre-HVW have no vertically overlapped portions.

8. The method of claim 1, wherein the field ring is doped to a smaller depth than the HVW.

9. A method comprising:
   providing a semiconductor substrate of a first conductivity type;
   implanting a top portion of a semiconductor substrate to form a pre-high-voltage well (pre-HVW), wherein the pre-HVW is of a second conductivity type opposite a first conductivity type;
   epitaxially growing a semiconductor layer on the semiconductor substrate and the pre-HVW to form an epitaxy layer;

implanting a portion of the epitaxy layer to form a high-voltage well (HVW) over and in contact with the pre-HVW, wherein the HVW has a greater width than the pre-HVW, and wherein the HVW is of the second conductivity type;

implanting a top portion of the HVW to form a field ring of the first conductivity type, wherein the steps of forming the field ring and the pre-HVW are performed using a same mask;

implanting a top portion of the epitaxy layer to form a first well-region, wherein the first well-region is of the second conductivity type, and wherein at least a portion of the first well-region is in the HVW;

implanting a top portion of the epitaxy layer to form a second well-region of the first conductivity type, wherein the first and the second well-regions are on opposite sides of the field ring;

forming an insulation region over and contacting the field ring and a portion of the HVW;

forming a gate electrode extend from over the first well-region to over the insulation region;

implanting a portion of the first well-region to form a drain region; and implanting a portion of the second well-region to form a source region, wherein the source region and the drain region are of the second conductivity type.

10. The method of claim 9, wherein the HVW and the pre-HVW are implanted to depths greater than about 8.5 μm.

11. The method of claim 9, wherein the first conductivity type is p-type, and the second conductivity type is n-type.

12. The method of claim 9, wherein the first conductivity type is n-type, and the second conductivity type is p-type.

13. The method of claim 9, wherein the first well-region and the pre-HVW have substantially no vertically overlapped portions.

14. The method of claim 13, wherein the first well-region and the pre-HVW have no vertically overlapped portions.

* * * * *